United States Patent
Lee et al.

(10) Patent No.: US 6,528,180 B1
(45) Date of Patent: Mar. 4, 2003

(54) LINER MATERIALS

(75) Inventors: Wei Ti Lee, San Jose, CA (US); Ted Guo, Palo Alto, CA (US); Gongda Yao, Freemont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/577,705

(22) Filed: May 23, 2000

(51) Int. Cl.$^7$ .......................... H01L 29/40; B32B 15/04

(52) U.S. Cl. .................. 428/621; 428/632; 428/651; 428/660; 428/432; 428/433; 428/469; 428/698; 428/332; 257/750; 257/751; 257/774

(58) Field of Search .................. 428/621, 627, 428/660, 698, 469, 432, 433, 632, 651; 257/774, 750, 751

(56) References Cited

U.S. PATENT DOCUMENTS

| | | | |
|---|---|---|---|
| 4,158,613 A | * 6/1979 | Sogo | 204/15 |
| 5,231,306 A | 7/1993 | Meikle et al. | 257/751 |
| 5,378,660 A | 1/1995 | Ngan et al. | 437/247 |
| 5,592,024 A | 1/1997 | Aoyama et al. | 257/751 |
| 5,679,980 A | 10/1997 | Summerfelt | 257/751 |
| 5,760,474 A | 6/1998 | Schuele | 257/754 |
| 5,824,599 A | * 10/1998 | Schacham-Diamand et al. | 438/678 |
| 5,856,236 A | 1/1999 | Lai et al. | 438/681 |
| 5,877,087 A | 3/1999 | Mosely et al. | 438/656 |
| 5,977,634 A | 11/1999 | Bai et al. | 257/751 |
| 5,989,999 A | 11/1999 | Levine et al. | 438/627 |
| 5,998,225 A | 12/1999 | Crenshaw et al. | 438/3 |
| 6,002,174 A | 12/1999 | Akram et al. | 257/751 |
| 6,013,576 A | 1/2000 | Oh et al. | 438/648 |
| 6,037,258 A | 3/2000 | Liu et al. | 438/687 |
| 6,153,935 A | * 11/2000 | Edelstein et al. | 257/773 |
| 6,197,688 B1 | * 3/2001 | Simpson | 438/678 |
| 6,207,558 B1 | 3/2001 | Singhvi et al. | 438/648 |
| 6,259,160 B1 | * 7/2001 | Lopatin et al. | 257/762 |
| 6,265,780 B1 | * 7/2001 | Yew et al. | 257/759 |
| 6,281,121 B1 | * 8/2001 | Brown et al. | 438/672 |
| 6,300,236 B1 | * 10/2001 | Harper et al. | 438/618 |

FOREIGN PATENT DOCUMENTS

| | | | |
|---|---|---|---|
| EP | 307272 | 3/1989 | |
| EP | 307272 A2 | * 3/1989 | |
| EP | 0 851 483 A2 | 7/1998 | ......... H01L/21/768 |
| EP | 0 856 884 A2 | 8/1998 | ......... H01L/21/768 |
| EP | 0 939 437 A2 | 9/1999 | ......... H01L/21/768 |
| JP | 2000-82741 | 3/2000 | ......... H01L/21/768 |
| WO | WO 98/54377 | 12/1998 | ........... C23C/14/14 |

OTHER PUBLICATIONS

PCT International Search Report from PCT/US 01/15991, dated Jan. 28, 2002.

Wada, J., et al., "Low Resistance Dual Damascene Process by New Al Reflow Using Nb Liner", Micro–electronics Engineering Laboratory, Toshiba Corp., Japan, 5 pages. (No Date).

(List continued on next page.)

Primary Examiner—Deborah Jones
Assistant Examiner—Stephen Stein
(74) Attorney, Agent, or Firm—Moser, Patterson & Sheridan

(57) ABSTRACT

A method for metallizing integrated circuits is disclosed. In one aspect, an integrated circuit is metallized by depositing liner material on a substrate followed by one or more metal layers. The liner material is selected from the group of tantalum (Ta), tantalum nitride (TaN), niobium (Nb), niobium nitride (NbN), vanadium (V), vanadium nitride (VN), and combinations thereof. The liner material is preferably conformably deposited on the substrate using physical vapor deposition (PVD). The one or more metal layers are deposited on the barrier layer using chemical vapor deposition (CVD), physical vapor deposition (PVD), or a combination of both CVD and PVD.

12 Claims, 4 Drawing Sheets

OTHER PUBLICATIONS

Ding, Y., et al., "Advanced Warm Aluminum for 0.25pm Plug Filling", 1998 Materials Research Society, pp. 243–249 (No Month).

Yao, G., et al., "Advance Aluminum Planarization Solutions for Sub 0.25pm Technologies", Applied Materials, 5 pages. (No Date).

Fix, R., "Chemical Vapor Deposition of Vanadium, Niobium, and Tantalum Nitride Thin Films", Department of Chemistry, Harvard University, Mass., 1993, 6 pages. (No Month).

Paranjpe, A., "CVD TaN Barrier for Copper Metallization and DRAM Bottom Electrode", CVC, Inc., Fremont, CA., 3 pages.

U.S. patent application Ser. No. 09/340,977.

U.S. patent application Ser. No. 09/522,635. No Date.

U.S. patent application Ser. No. 09/612,854.

* cited by examiner

LINER MATERIALS

BACKGROUND OF THE DISCLOSURE

1. Field of the Invention

The present invention relates to liner materials and, more particularly the use of liner materials in integrated circuit fabrication.

2. Description of the Background Art

Integrated circuits have evolved into complex devices that can include millions of components (e. g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e. g., sub-micron dimensions), the materials used to fabricate such components contribute to the electrical performance of such components. For example, low resistivity metal interconnects (e. g., aluminum and copper) provide conductive paths between the components on integrated circuits. Typically, the metal interconnects are electrically isolated from each other by an insulating material.

Additionally, a liner material often separates the metal interconnects from the insulating material. The liner material can be a barrier layer to inhibit the diffusion of the metal into the insulating material. Diffusion of the metal into the insulating material is undesirable because such diffusion can affect the electrical performance of the integrated circuit, or render it inoperative. Alternatively, the liner material can be a nucleation layer (e. g., wetting layer) to which the interconnect metallization is adherent.

A combination of titanium (Ti) and/or titanium nitride (TiN), for example, is often used for the liner material. However, at high temperatures (e. g., temperatures greater than about 400° C.) Ti and/or TiN may react with Al to form titanium tri-aluminide ($TiAl_3$). The formation of the $TiAl_3$ reduces the effective linewidth of the aluminum interconnects which undesirably increases the resistance of such interconnects and degrades the overall performance of the integrated circuit.

Therefore, a need exists in the art for integrated circuit metallization schemes including liner materials that are non-reactive with the metals used to form interconnects.

SUMMARY OF THE INVENTION

The present invention provides a method for metallizing integrated circuits. In one aspect, an integrated circuit is metallized by depositing liner material on a substrate followed by one or more metal layers. The liner material is selected from tantalum (Ta), tantalum nitride (TaN), niobium (Nb), niobium nitride (NbN), vanadium (V), vanadium nitride (VN), and combinations thereof. The liner material is preferably conformably deposited on the substrate using physical-vapor deposition (PVD). The one or more metal layers are conformably deposited on the barrier layer using chemical vapor deposition (CVD), physical vapor deposition (PVD), or a combination of both CVD and PVD.

In another aspect, a damascene interconnect is fabricated. In one embodiment, a process sequence includes providing a substrate with one or more dielectric layers thereon. The one or more dielectric layers on the substrate, have apertures defined therein. Liner material selected from tantalum (Ta), tantalum nitride (TaN), niobium (Nb), niobium nitride (NbN), vanadium (V), vanadium nitride (VN), and combinations thereof is conformably deposited on the one or more dielectric layers. Thereafter, the damascene interconnect is formed when one or more metal layers are conformably deposited on the liner material. The liner material is preferably conformably deposited on the substrate using physical vapor deposition (PVD). The one or more metal layers are conformably deposited on the barrier layer using chemical vapor deposition (CVD), physical vapor deposition (PVD), or a combination of both CVD and PVD.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
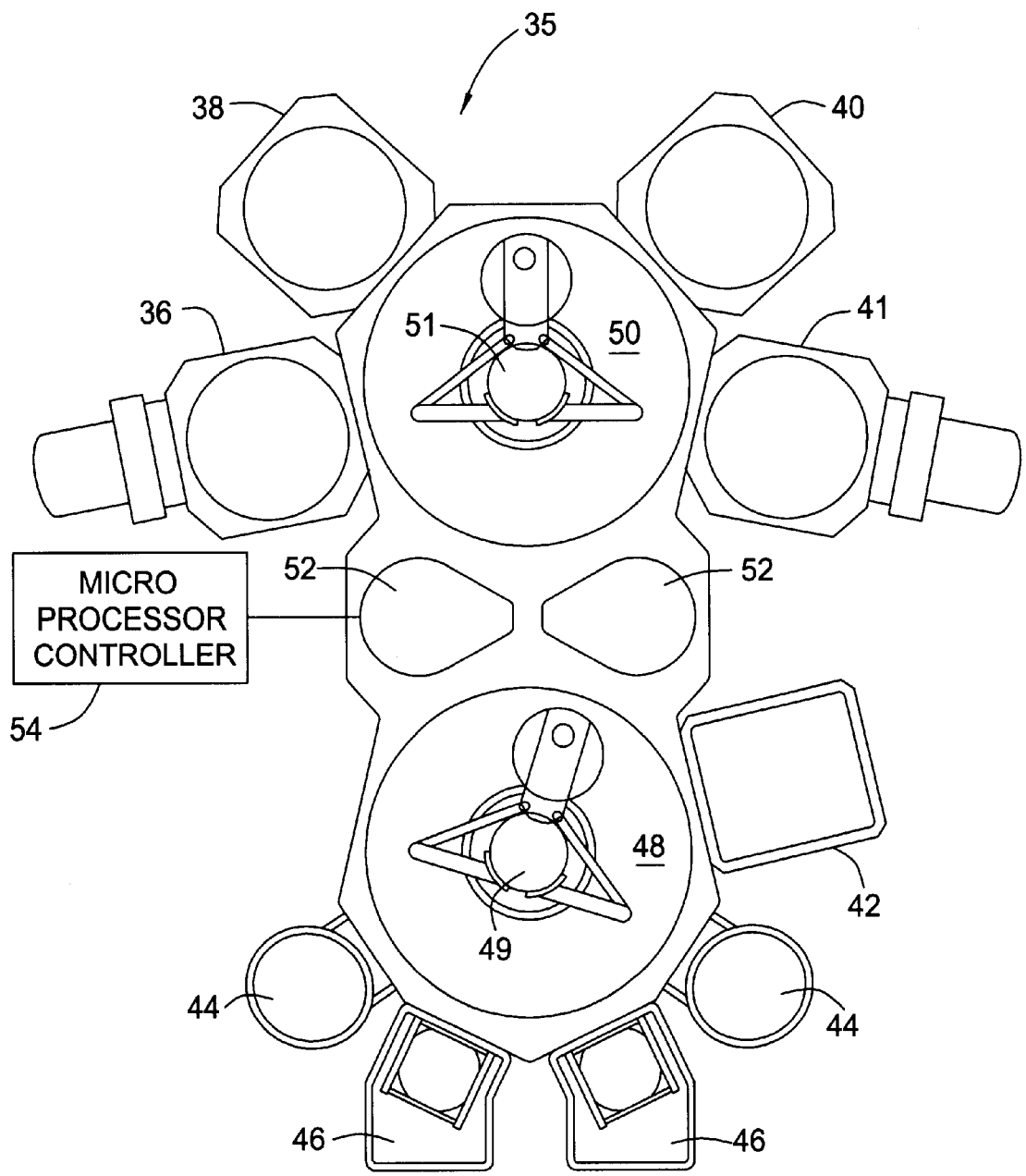
FIG. 1 depicts a schematic illustration of an apparatus that can be used for the practice of this invention.

FIG. 1 is a schematic representation of a wafer processing system 35 that can be used to perform integrated circuit metallization in accordance with the present invention. This apparatus typically comprises process chambers 36, 38, 40, 41, degas chambers 44, load-lock chambers 46, transfer chambers 48, 50, pass-through chambers 52, a microprocessor controller 54, along with other hardware components such as power supplies (not shown) and vacuum pumps (not shown). An example of such a wafer processing system 35 is an ENDURA® System commercially available from Applied Materials, Inc., Santa Clara, Calif.

Details of the wafer processing system 35 used in the present invention are described in commonly assigned U.S. Pat. No. 5,186,718, entitled "Staged-Vacuum Substrate Processing System and Method", issued on Feb. 16, 1993, and is hereby incorporated by reference. The salient features of this system 35 are briefly described below.

The wafer processing system 35 includes two transfer chambers 48, 50 each containing a transfer robot 49, 51. The transfer chambers 48, 50 are separated one from the other by pass through chambers 52.

Transfer chamber 48 is coupled to load-lock chambers 46, degas chambers 44, pre-clean chamber 42, and pass through chambers 52. Substrates (not shown) are loaded into the wafer processing system 35 through load-lock chambers 46. Thereafter, the substrates are sequentially degassed and cleaned in degas chambers 44 and the pre-clean chamber 42, respectively. The transfer robot 48 moves the substrates between the degas chambers 44 and the pre-clean chamber 42.

Transfer chamber 50 is coupled to a cluster of process chambers 36, 38, 40, 41. The cleaned substrates are moved from transfer chamber 48 into transfer chamber 50 via pass through chambers 52. Thereafter, transfer robot 51 moves the substrates between one or more of the process chambers 36, 38, 40, 41.

The process chambers 36, 38, 40, 41 are used to perform various integrated circuit fabrication sequences. For example, process chambers 36, 38, 40, 41 may include physical vapor deposition (PVD) chambers, ionized metal plasma physical vapor deposition (IMP PVD) chambers, chemical vapor deposition (CVD) chambers, and anti-reflective coating (ARC) chambers, among others.

Figure 2:
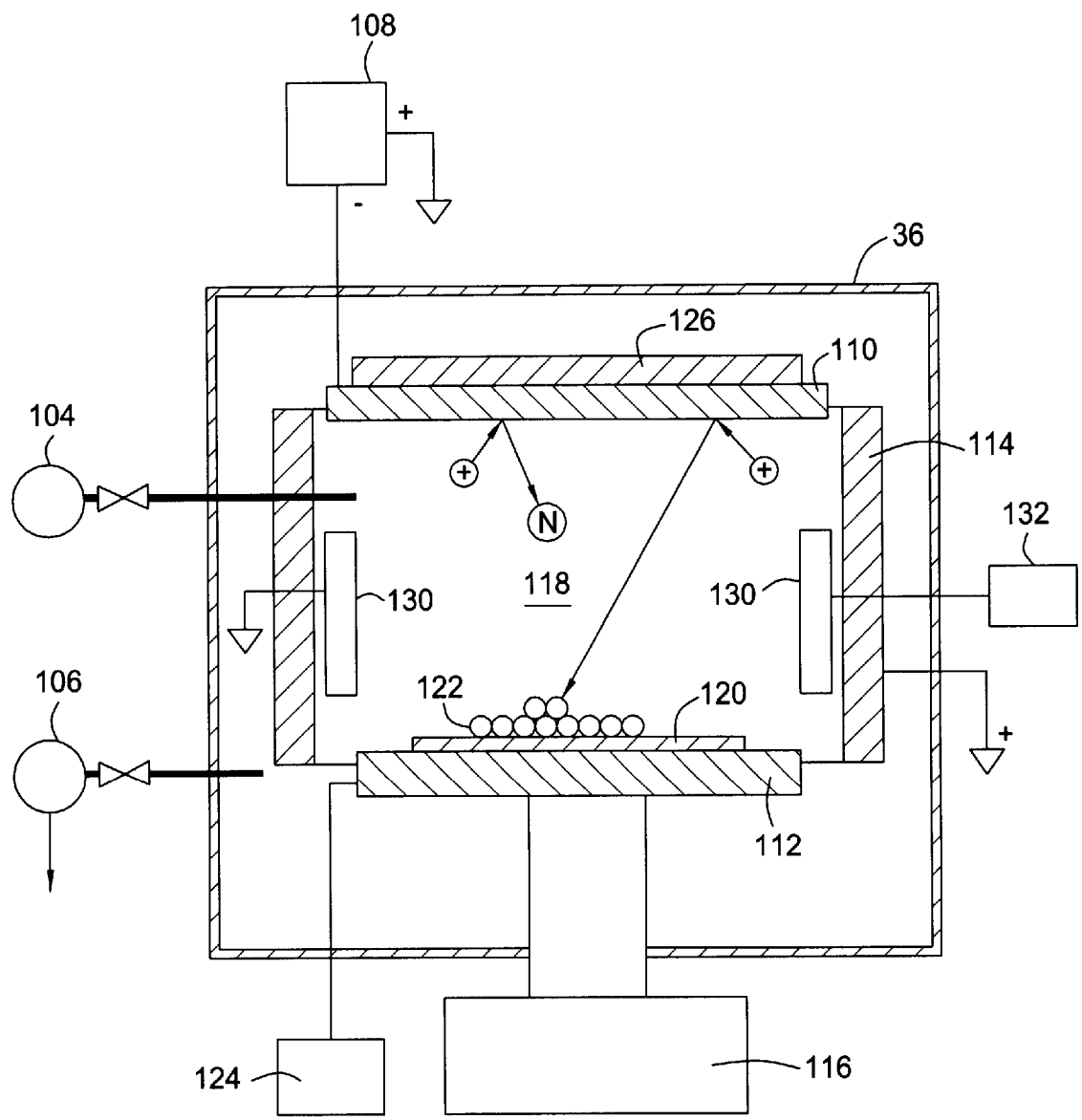
FIG. 2 depicts a schematic cross-sectional view of a sputtering type physical vapor deposition (PVD) chamber.

FIG. 2 depicts a schematic cross-sectional view of a sputtering-type physical vapor deposition (PVD) process chamber 36 of wafer processing system 35. An example of such a PVD process chamber 36 is an IMP VECTRA™ chamber commercially available from Applied Materials, Inc., Santa Clara, Calif.

The PVD chamber 36 is coupled to a gas source 104, a pump system 106 and a target power source 108. The PVD chamber 36 encloses a target 110, a substrate 120 positioned on a vertically movable pedestal 112, and a shield 114 enclosing a reaction zone 118. A lift mechanism 116 is coupled to the pedestal 112 to position the pedestal 112 relative to the target 110.

The gas source 104 supplies a process gas into the PVD chamber 36. The process gas generally includes argon (Ar) or some other inert gas. The pump system 106 controls the pressure within the PVD chamber 36.

The target 110 is typically suspended from the top of the PVD chamber 36. The target 110 includes a material that is sputtered during operation of the wafer processing system 35. Although the target 110 may comprise, as a material to be deposited, an insulator or semiconductor, the target 110 generally comprises a metal. For example, the target 110 may be formed of aluminum (Al), copper (Cu), tantalum (Ta), niobium (Nb), vanadium (V) and combinations thereof as well as other materials known in the art.

The pedestal 112 supports the substrate 120 within the PVD chamber 36. The pedestal 112 is generally disposed at a fixed distance from the target 110 during processing. However, the distance between the target 110 and the substrate 120 may also be varied during processing. The pedestal 112 is supported by the lift mechanism 116, which moves the pedestal 112 along a range of vertical motion within the PVD chamber 36.

The PVD chamber 36 may comprise additional components for improving the deposition of sputtered particles onto the substrate 120. For example, the PVD chamber 36 may include an additional bias power source 124 for biasing the substrate 120. The bias power source 124 is coupled to the pedestal 112 for controlling the deposition of the film 122 onto the substrate 120. The power source 124 is typically an AC source having a frequency of, for example, about 400 kHz.

The PVD chamber 36 may also comprise a magnet 126 or magnetic sub-assembly positioned behind the target 110 for creating a magnetic field proximate to the target 110. The PVD chamber 36 may also comprise a coil 130 proximately disposed within the shield 114, but between the target 110 and the substrate 112. The coil 130 may comprise either a single-turn coil or multi-turn coil that, when energized, ionizes the sputtered particles. The process is known as Ion Metal Plasma (IMP) deposition. The coil 130 is generally connected to an AC source 132 having a frequency of, for example, about 2 MHz.

The target power source 108 that is used to infuse the process gas with energy may comprise a DC source, a radio frequency (RF) source, or a DC-pulsed source. Applying either DC or RF power in this manner creates an electric field in the reaction zone 118. The electric field ionizes the process gas in the reaction zone 118 to form a plasma comprising process gas ions, electrons and process gas atoms (neutrals). Additionally, the electric field accelerates the process gas ions toward the target 110 for sputtering target particles from the target 110. If electrons in the plasma collide into the sputtered target particles, these target particles become ionized.

This configuration enables deposition of sputtered and ionized target particles from the target 110 onto the substrate 120 to form a film 122 thereon. The shield 114 confines the sputtered particles and non-reactant gas in a reaction zone 118 within the PVD chamber 36. As such, the shield 114 prevents deposition of target particles in unwanted locations, for example, beneath the pedestal 112 or behind the target 110.

Once the bias power source 124 is applied, electrons in the plasma quickly accumulate to the substrate, creating a negative DC offset on the substrate 120 and the pedestal 112. The negative bias at the substrate 120 attracts sputtered target particles that become ionized. The target particles are generally attracted to the substrate 120 in a direction that is substantially orthogonal to the substrate 120. As such, the bias power source 124 enhances deposition of target particles over an unbiased substrate 120.

To improve the coverage and distribution of sputtered target material along the sidewalls within a substrate via or trench, the separation distance between the target 110 and substrate 120 is minimal, such as, for example, about 50 millimeters. The close proximity between the target 110 and the substrate 120 minimizes the possibility of these collisions within the reaction zone 118, while maximizing the collisions that occur within the trenches and vias on the substrate 120. The collisions of the sputtered target particles with the process gas atoms and ions within the vias or trenches redirects the target particles toward the sidewalls, thereby increasing the rate of deposition of the target material on the sidewalls.

Figure 3:
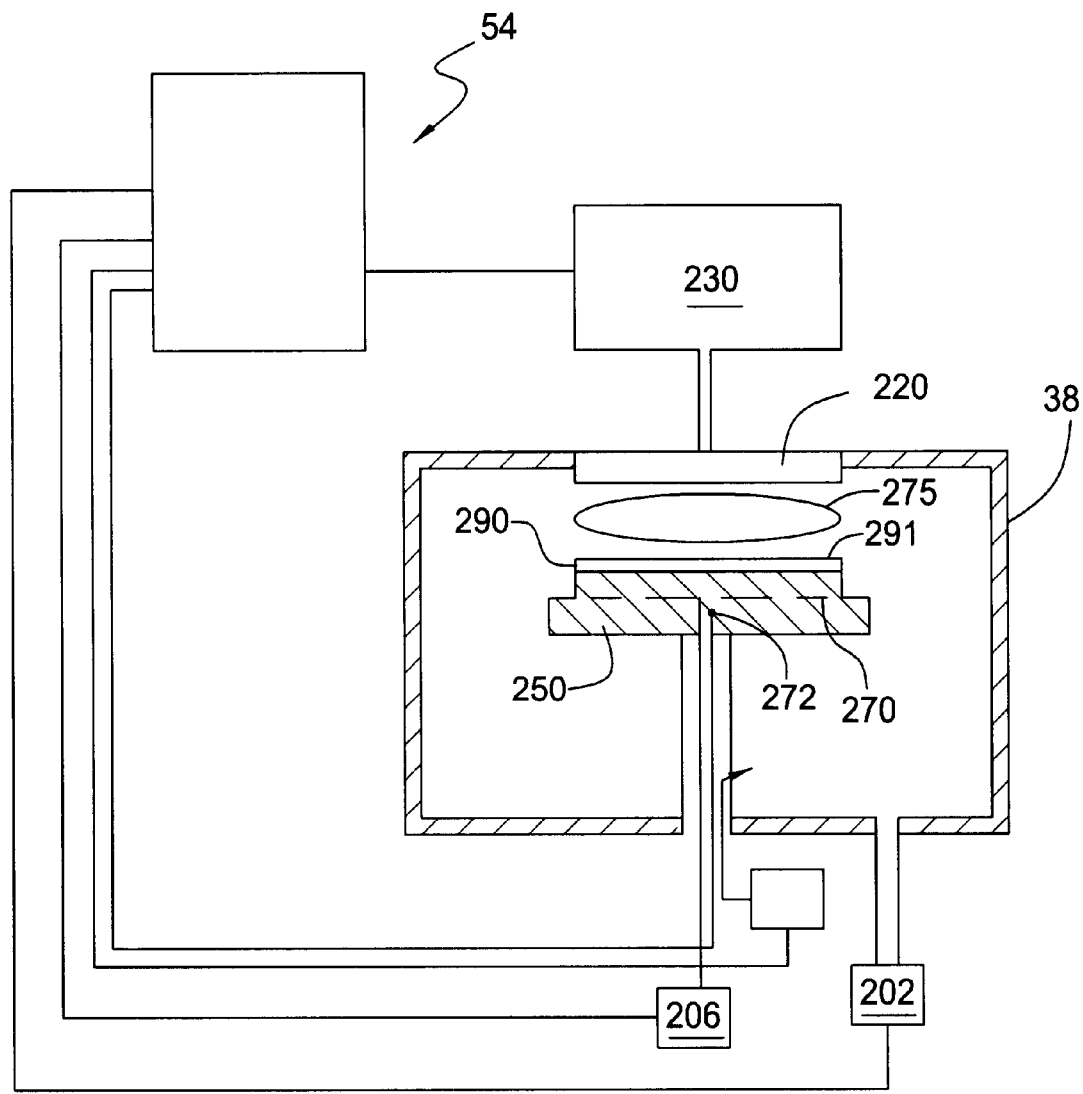
FIG. 3 depicts a schematic cross-sectional view of a plasma enhanced chemical vapor deposition (CVD) chamber.

FIG. 3 depicts a schematic cross-sectional view of a chemical vapor deposition (CVD) process chamber 38 of wafer processing system 35. Examples of such CVD process chambers 36 include TXZ™ chambers and WXZ™ chambers, commercially available from Applied Materials, Inc., Santa Clara, Calif.

The CVD process chamber 38 generally houses a wafer support pedestal 250, which is used to support a substrate 290. The wafer support pedestal 250 can typically be moved in a vertical direction inside the CVD process chamber 38 using a displacement mechanism (not shown). Depending on the specific CVD process, the substrate 290 can be heated to some desired temperature prior to or during deposition. For example, the wafer support pedestal 250 is heated by an embedded heater element 270. The pedestal may be resistively heated by applying an electric current from an AC power supply 206 to the heater element 270. The substrate 290 is, in turn, heated by the pedestal 250. A temperature sensor 272, such as a thermocouple, is also embedded in the wafer support pedestal 250 to monitor the temperature of the pedestal 250 in a conventional manner. The measured temperature is used in a feedback loop to control the AC power supply 206 for the heating element 270, such that the substrate temperature can be maintained or controlled at a desired temperature which is suitable for the particular process application. The pedestal 250 is optionally heated using a plasma or by radiant heat (not shown).

A vacuum pump 202, is used to evacuate the CVD process chamber 38 and to maintain the proper gas flows and pressures inside the chamber 38. A showerhead 220, through which process gases are introduced into the chamber 38, is located above the wafer support pedestal 250. The showerhead 220 is connected to a gas panel 230, which controls and supplies various gases provided to the chamber 38.

Proper control and regulation of the gas flows through the gas panel 230 is performed by mass flow controllers and a microprocessor controller 54. The showerhead 220 allows process gases from the gas panel 230 to be uniformly introduced and distributed in the CVD process chamber 38.

The showerhead 220 and wafer support pedestal 250 may also form a pair of spaced apart electrodes. When an electric field is generated between these electrodes, the process gases introduced into the chamber 38 are ignited into a plasma. Typically, the electric field is generated by connecting the wafer support pedestal 250 to a source of radio frequency (RF) power (not shown) through a matching network (not shown). Alternatively, the RF power source and matching network may be coupled to the showerhead 220, or coupled to both the showerhead 220 and the wafer support pedestal 250.

Plasma enhanced chemical vapor deposition (PECVD) techniques promote excitation and/or disassociation of the reactant gases by the application of the electric field to the reaction zone 275 near the substrate surface 291, creating a plasma of reactive species. The reactivity of the species in the plasma reduces the energy required for a chemical reaction to take place, in effect lowering the required temperature for such PECVD processes.

Referring to FIG. 1, both the PVD process chamber 36 and the CVD process chamber 38 as described above are controlled by a microprocessor controller 54. The microprocessor controller 54 may be one of any form of general purpose computer processor that can be used in an industrial setting for controlling various chambers and sub-processors. The computer may use any suitable memory, such as random access memory, read only memory, floppy disk drive, hard disk, or any other form of digital storage, local or remote. Various support circuits may be coupled to the CPU for supporting the processor in a conventional manner. Software routines as required may be stored in the memory or executed by a second CPU that is remotely located.

The software routines are executed after the substrate is positioned on the pedestal. The software routine, when executed, transforms the general purpose computer into a specific process computer that controls the chamber operation so that the deposition process is performed. Alternatively, the process of the present invention may be performed in hardware, as an application specific integrated circuit or other type of hardware implementation, or a combination of software and hardware.

Barrier/Metal Layer Deposition

The present invention provides a method for metallizing integrated circuits. In one aspect, an integrated circuit is metallized by depositing liner material on a substrate followed by one or more metal layers. The liner material is selected from tantalum (Ta), tantalum nitride (TaN), niobium (Nb), niobium nitride (NbN), vanadium (V), vanadium nitride (VN), and combinations thereof. The liner material is preferably conformably deposited on the substrate using physical vapor deposition (PVD).

Nitrogen is provided to the PVD deposition chamber when nitride based liner material is to be formed. Also, an inert gas such as helium (He) or argon (Ar) may be provided to the PVD deposition chamber to maintain such chamber within the desired chamber pressure.

In general, the following deposition process parameters can be used to deposit the liner material. The process parameters range from a wafer temperature of about 20° C. to about 300° C., a chamber pressure of about 0.5 millitorr to about 20 millitorr, and a DC power of between about 1 kilowatt to about 80 kilowatts.

After the liner material is deposited on the substrate, one or more layers of a metal are formed thereon. The one or more metal layers are conformably deposited on the barrier layer using chemical vapor deposition (CVD), physical vapor deposition (PVD), or a combination of both CVD and PVD. Typically, a CVD deposited metal layer (thickness in a range of about 200 Å to about 10,000 Å) is formed conformably on the barrier layer followed by a PVD deposited metal layer.

The one or more metal layers are preferably selected from copper, aluminum, tungsten, or other conductive material, as well as combinations thereof. For the PVD process, aluminum, tungsten or copper targets are used.

In general, the following process parameters can be used to form the PVD metal layer. The process parameters range from a wafer temperature of about 20° C. to about 700° C., a chamber pressure of about 0.5 millitorr to about 20 millitorr, and a DC power of between about 1 kilowatt to about 80 kilowatts. Also, a gas such as hydrogen ($H_2$) or argon (Ar) may be provided to the PVD deposition chamber to maintain such chamber within the desired chamber pressure.

For the CVD process, an aluminum (Al) layer may be deposited from a reaction of a gas mixture containing dimethyl aluminum hydride (DMAH) and hydrogen ($H_2$) or argon (Ar) or other DMAH containing compounds. A CVD tungsten (W) layer may be deposited from a gas mixture containing tungsten hexafluoride ($WF_6$). A CVD copper (Cu) layer may be deposited from a gas mixture containing $Cu^{+2}(hfac)_2$ (copper hexafluoro acetylacetonate), $Cu^{+2}(fod)_2$ (copper heptafluoro dimethyl octanediene), $Cu^{+1}$hfac TMVS (copper hexafluoro acetylacetonate trimethylvinylsilane), or combinations thereof.

In general, the following process parameters can be used to form the CVD metal layer. The process parameters range from a wafer temperature of about 150° C. to about 350° C., a chamber pressure of about 2 torr to about 30 torr, and a gas mixture flow rate of about 500 sccm to about 10,000 sccm.

The above process parameters are suitable for implementation on a 200 mm (millimeter) substrate in a deposition chamber available from Applied Materials, Inc. Other deposition chambers are within the scope of the invention, and the parameters listed above may vary according to the particular deposition chambers used to deposit the liner material as well as the one or more metal layers. For example, other deposition chambers may have a larger (e. g., configured to accommodate 300 mm substrates) or smaller volume, requiring gas flow rates, or powers that are larger or smaller than those recited for deposition chambers available from Applied Materials, Inc.

Liner materials selected from Ta, TaN, Nb, NbN, V, and VN generate overlying metal films of aluminum and copper with strong <111> grain orientation. Strong <111> grain orientation is characteristic of films with good electromigration reliability.

Integrated Circuit Fabrication

Damascene Interconnect

Figure 4A:
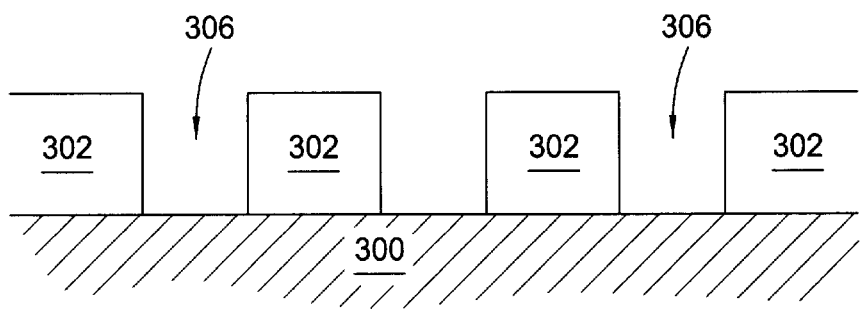
FIGS. 4a–4d illustrate schematic cross-sectional views of a damascene interconnect at different stages of integrated circuit fabrication.

FIGS. 4a–4d illustrate schematic cross-sectional views of a substrate 300 at different stages of a damascene interconnect fabrication sequence. Depending on the specific stage of processing, substrate 300 may correspond to a silicon substrate, or other material layer that has been formed on the substrate 300. FIG. 4a, for example, illustrates a cross-sectional view of a substrate 300 having a dielectric layer 302 thereon. The dielectric layer 302 may be an oxide (e. g., silicon dioxide, fluorosilicate glass). In general, the substrate 300 may include a layer of silicon, silicides, metals, or other materials.

FIG. 4a illustrates one embodiment in which the substrate 300 is silicon having a fluorosilicate glass layer formed thereon. The dielectric layer has a thickness of about 10,000 Å to about 20,000 Å, depending on the size of the structure to be fabricated.

The dielectric layer 302 has apertures 306 therethrough. The apertures 306 have dimensions less than about 0.5 μm (micrometer), providing aspect ratio structures in the range of about 3:1 to about 4:1.

Figure 4B:
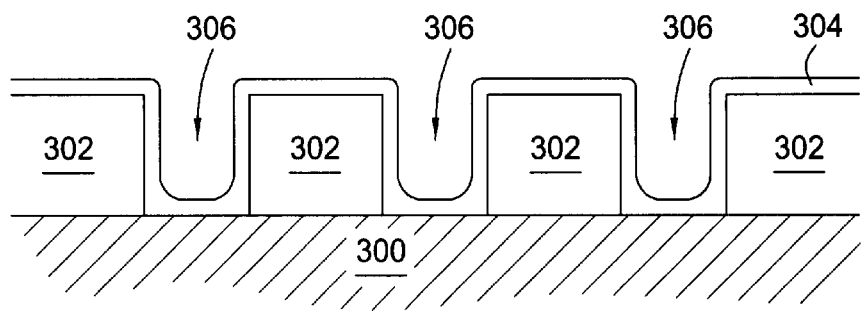

Referring to FIG. 4b, liner material 304 is conformably deposited on the dielectric layer 302. The liner material 304 is conformably deposited on the dielectric layer according to the process parameters described above. The liner material is selected from Ta, TaN, Nb, NbN, V, VN, or combinations thereof.

The thickness of the liner material 304 is variable depending on the specific stage of processing. Typically, the liner material 304 has a thickness of about 200 Å to about 600 Å.

Figure 4C:
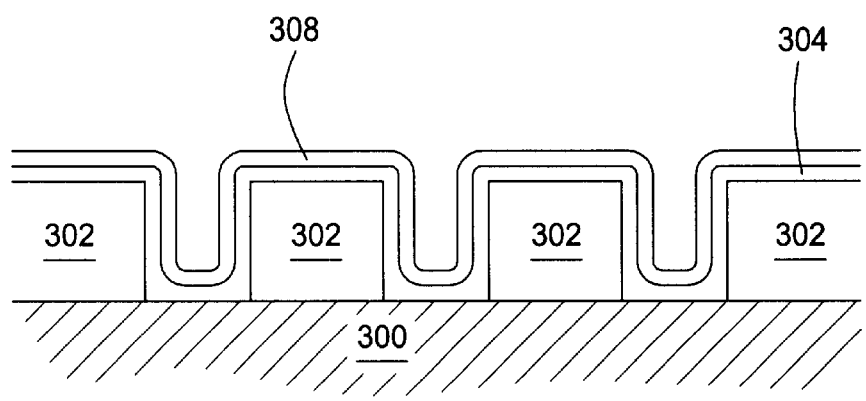

After the liner material 304 is deposited conformably on the dielectric layer 302, a CVD metal layer 308 is formed thereon, as depicted in FIG. 4c. The CVD metal layer 308 is selected from Al, Cu, or combinations thereof. The CVD metal layer 308 has a thickness of about 200 Å to about 10,000 Å.

Figure 4D:
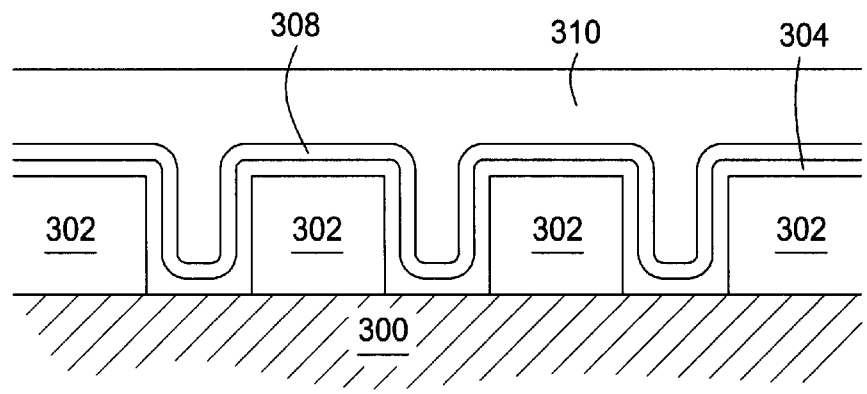

Referring to FIG. 4d, the damascene interconnect is completed with the filling of the apertures with a PVD metal layer 310. The PVD metal layer 310 is selected from Al, Cu, or combinations thereof. The PVD metal layer 310 has a thickness of about 2000 Å to about 10,000 Å.

Although several preferred embodiments, which incorporate the teachings of the present invention, have been shown and described in detail, those skilled in the art can readily devise many other varied embodiments that still incorporate these teachings.

What is claimed is:

1. A device, comprising:
    a substrate;
    liner material conformably deposited on the substrate, wherein the liner material is selected from the group consisting of tantalum (Ta), tantalum nitride (TaN), niobium (Nb), niobium nitride (NbN), vanadium (V), vanadium nitride (VN), and combinations thereof; and
    one or more metal layers comprising aluminum conformably deposited over the liner material.

2. The device of claim 1 wherein the substrate has one or more dielectric layers formed thereon.

3. The device of claim 2 wherein the one or more dielectric layers are selected from the group consisting of fluorinated silicate glass (FSG), oxynitride, silicon oxide and combinations thereof.

4. The device of claim 2 wherein the one or more dielectric layers have apertures formed therein.

5. The device of claim 4 wherein the apertures are formed through the one or more dielectric layers to the substrate surface.

6. The device of claim 4 wherein the apertures each have dimensions less than about 1 μm (micrometer).

7. The device of claim 1 wherein the liner material has a thickness in a range of about 50 Å to about 1000 Å.

8. A damascene interconnect, comprising:
    a substrate;
    one or more dielectric layers formed on the substrate, wherein the one or more dielectric layers have apertures therein;
    liner material conformably deposited on the surfaces of the apertures, wherein the liner material is selected from the group consisting of tantalum (Ta), tantalum nitride (TaN), niobium (Nb), niobium nitride (NbN), vanadium (V), vanadium nitride (VN), and combinations thereof; and
    one or more metal layers comprising aluminum conformably deposited on the liner.

9. The damascene interconnect of claim 8 wherein the one or more dielectric layers are selected from the group consisting of fluorinated silicate glass (FSG), oxynitride, silicon nitride and combinations thereof.

10. The damascene interconnect of claim 8 wherein the apertures are formed through the one or more dielectric layers to the substrate surface.

11. The damascene interconnect of claim 8 wherein the apertures each have dimensions less than about 1 μm (micrometer).

12. The damascene interconnect of claim 8 wherein the liner material has a thickness in a range of about 50 Å to about 1000 Å.

* * * * *